United States Patent
Zeng et al.

(10) Patent No.: US 12,362,598 B2
(45) Date of Patent: Jul. 15, 2025

(54) DEMODULATION APPARATUS AND METHOD FOR WIRELESS POWER TRANSFER SYSTEMS

(71) Applicant: NuVolta Technologies (Hefei) Co., Ltd., Hefei (CN)

(72) Inventors: Yunqiang Zeng, Shenzhen (CN); Zeng Li, Shanghai (CN); Zhijun Luo, Shanghai (CN); Lingli Fan, Shanghai (CN); Hang Meng, Shenzhen (CN)

(73) Assignee: NuVolta Technologies (Hefei) Co., Ltd., Hefei (CN)

( * ) Notice: Subject to any disclaimer, the term of this patent is extended or adjusted under 35 U.S.C. 154(b) by 209 days.

(21) Appl. No.: 18/144,016

(22) Filed: May 5, 2023

(65) Prior Publication Data

US 2024/0356373 A1    Oct. 24, 2024

(30) Foreign Application Priority Data

Apr. 19, 2023    (CN) .......................... 202310433549.9

(51) Int. Cl.
*H02J 50/12* (2016.01)
*H02J 50/80* (2016.01)
*H02M 3/335* (2006.01)
*H03K 5/24* (2006.01)

(52) U.S. Cl.
CPC .............. *H02J 50/12* (2016.02); *H02J 50/80* (2016.02); *H02M 3/33576* (2013.01); *H03K 5/24* (2013.01)

(58) Field of Classification Search
CPC . H02J 50/10; H02J 50/12; H02J 50/80; H04B 5/79
See application file for complete search history.

(56) References Cited

U.S. PATENT DOCUMENTS

| | | | | |
|---|---|---|---|---|
| 2010/0001684 | A1* | 1/2010 | Eastlack | H02J 50/10 320/108 |
| 2010/0176659 | A1* | 7/2010 | Aoyama | H04B 5/45 307/104 |
| 2020/0381947 | A1* | 12/2020 | Bhandarkar | H02M 3/1582 |
| 2024/0006918 | A1* | 1/2024 | Liu | H02M 1/0025 |

* cited by examiner

*Primary Examiner* — Rexford N Barnie
*Assistant Examiner* — Rasem Mourad
(74) *Attorney, Agent, or Firm* — AP3 Law Firm PLLC

(57) ABSTRACT

An apparatus includes a differential amplifier unit having a first input coupled to a common node of a first coil and a first resonant capacitor, and a second input coupled to a switching node of a bridge, a reference crossing comparator unit having an input coupled to an output of the differential amplifier unit, and a logic unit having a first input coupled to an output of the reference crossing comparator unit and a second input coupled to the switching node of the bridge, wherein the logic unit is configured to generate a signal for retrieving a modulated signal.

20 Claims, 8 Drawing Sheets

DEMODULATION APPARATUS AND METHOD FOR WIRELESS POWER TRANSFER SYSTEMS

PRIORITY CLAIM

This application claims priority to Chinese Patent Application No. 2023104335499, filed on Apr. 19, 2023, which is hereby incorporated by reference in its entirety.

TECHNICAL FIELD

The present invention relates to a demodulation apparatus, and, in particular embodiments, to a method for demodulating a signal in a transmitter of a wireless power transfer system.

BACKGROUND

As technologies further advance, wireless power transfer has emerged as an efficient and convenient mechanism for powering or charging battery based mobile devices such as mobile phones, tablet PCs, digital cameras, MP3 players and/or the like. A wireless power transfer system typically comprises a primary side transmitter and a secondary side receiver. The primary side transmitter is magnetically coupled to the secondary side receiver through a magnetic coupling. The magnetic coupling may be implemented as a loosely coupled transformer having a primary side coil formed in the primary side transmitter and a secondary side coil formed in the secondary side receiver.

The primary side transmitter may comprise a power conversion unit such as a primary side of a power converter. The power conversion unit is coupled to a power source and is capable of converting electrical power to wireless power signals. The secondary side receiver is able to receive the wireless power signals through the loosely coupled transformer and convert the received wireless power signals to electrical power suitable for a load.

In a wireless power transfer system, various control signals may be generated based upon the operating parameters at the secondary side receiver. The control signals may be transferred from the secondary side receiver to the primary side transmitter. In particular, the control signals may be transmitted from a receiver coil to a transmitter coil in the form of modulated signals using suitable modulation schemes. Amplitude shift keying (ASK) is a widely used modulation scheme in the receiver of the wireless power transfer system. ASK is carried out through modulating the amplitude of the analog signal in the wireless power transfer system. Information is passed through the amplitude variation of the analog signal. An analog sensing device is employed to detect the control signals, which may be included in the current and/or the voltage applied to the transmission coil. A demodulator at the primary side transmitter may be employed to demodulate the signals detected by the analog sensing device and feed the demodulated signals to a transmitter controller so as to better control the operation of the transmitter.

The communication information may be transferred from the receiver to the transmitter through varying the operating parameters of the transmitter. One relatively simple method to vary the operating parameters of the transmitter is based on an impedance modulation method. For example, a pair of capacitor-switch networks is coupled to two terminals of the receiver coil, respectively. The switches of the pair of capacitor-switch networks are switched on and off during communication so that the impedance coupled to the receiver coil is changed. The impedance variation has an impact on the electrical characteristics of the transmitter. In response to this impact, some operating parameters (e.g., the current flowing through the transmitter coil and/or the voltage across the transmitter coil) may vary. The control circuit in the transmitter detects the variation of at least one operating parameter and retrieves the communication information through demodulating the variation of this operating parameter.

As wireless power transfer systems further advance, the frequency of the wireless power transfer systems has increased significantly. The operating frequency of the wireless charging WPC1.3 standard is in a range from 87K Hz to 205K Hz. The ASK signal modulation method at the receiving end is mainly capacitive modulation. The advantage of the ASK signal modulation is that the modulated signal is strong and easy to be demodulated. The disadvantage of the ASK signal modulation is that the modulation may reduce the wireless power transfer efficiency. In addition, the modulation may cause noise problems.

In order to solve the above-mentioned problems, the operating frequency of some receivers has been increased to 360K Hz. The modulation method has been changed from the capacitance-based modulation scheme to a resistance-based modulation scheme. The modulation generates a relatively weak data signal. The traditional demodulation may have a high packet loss rate in processing the weak data signal.

As the power of the wireless power transfer system goes higher, there may be a need for efficiently and reliably demodulating communication information transferred from the receiver to the transmitter. The present disclosure addresses this need.

SUMMARY

These and other problems are generally solved or circumvented, and technical advantages are generally achieved, by preferred embodiments of the present disclosure which provide a method for demodulating a signal in a transmitter of a wireless power transfer system.

In accordance with an embodiment, an apparatus comprises a differential amplifier unit having a first input coupled to a common node of a first coil and a first resonant capacitor, and a second input coupled to a switching node of a bridge, a reference crossing comparator unit having an input coupled to an output of the differential amplifier unit, and a logic unit having a first input coupled to an output of the reference crossing comparator unit and a second input coupled to the switching node of the bridge, wherein the logic unit is configured to generate a signal for retrieving a modulated signal.

In accordance with another embodiment, a method comprises in a demodulation process, converting, using a differential amplifier unit, a voltage signal across a resonant capacitor into an intermediate signal comprising an ac component and a dc component, removing the dc component of the intermediate signal using a dc blocking unit, feeding the ac component of the intermediate signal into a reference crossing comparator unit to generate a first PWM signal, and performing a logic operation on the first PWM signal and a switching node signal to generate a second PWM signal for retrieving a modulated signal.

In accordance with yet another embodiment, a system comprises a transmitter coil configured to be magnetically coupled to a receiver coil, a resonant capacitor connected in series with the transmitter coil between a first switching node and a second switching node of a full bridge converter, and a demodulation apparatus comprising a first demodulation unit and a second demodulation unit connected in cascade, wherein the first demodulation unit comprises a differential amplifier unit having a first input coupled to a common node of a first coil and a first resonant capacitor, and a second input coupled to a switching node of the full bridge converter, a dc blocking unit having an input coupled to an output of the differential amplifier unit, a reference crossing comparator unit having an input coupled to an output of the dc blocking unit, and a logic unit having a first input coupled to an output of the reference crossing comparator unit and a second input coupled to the switching node of the full bridge converter, wherein the logic unit is configured to generate a signal for retrieving a modulated signal.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a method for demodulating a signal in a transmitter of a wireless power transfer system. The disclosure may also be applied, however, to controlling various communication devices in electronic systems. Hereinafter, various embodiments will be explained in detail with reference to the accompanying drawings.

Figure 1:
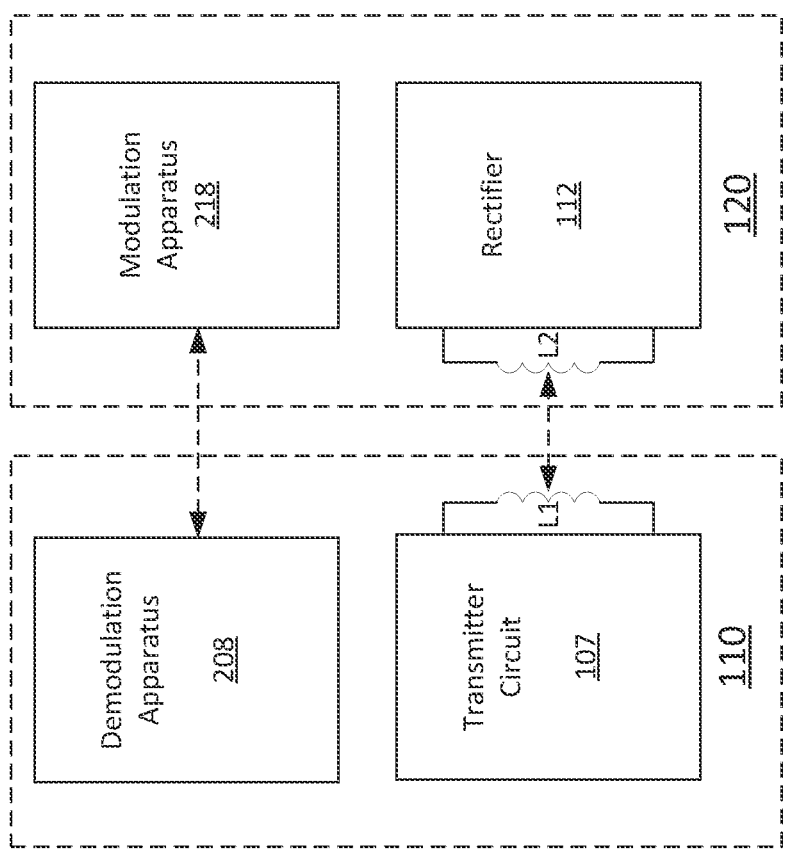
FIG. 1 illustrates a simplified block diagram of a wireless power transfer system in accordance with various embodiments of the present disclosure.

FIG. 1 illustrates a simplified block diagram of a wireless power transfer system in accordance with various embodiments of the present disclosure. The wireless power transfer system comprises a transmitter 110 and a receiver 120. The transmitter 110 comprises a demodulation apparatus 208, a transmitter circuit 107 and a transmitter coil L1. The receiver 120 comprises a modulation apparatus 218, a rectifier 112 and a receiver coil L2.

In some embodiments, the demodulation apparatus 208 and the modulation apparatus 218 form a communication apparatus configured to provide an in-band communication between the receiver 120 and the transmitter 110 of the wireless power transfer system.

In order to achieve the in-band communication, a plurality of switch-capacitor networks may be coupled to the receiver coil L2 of the wireless power transfer system. The demodulation apparatus 208 and the modulation apparatus 218 are designed based on an amplitude shift keying (ASK) modulation used by the wireless power transfer system. In operation, the plurality of switch-capacitor networks is configured such that an impedance coupled to the receiver coil is adjusted according to the ASK modulation used by the wireless power transfer system. Furthermore, the plurality of switch-capacitor networks is configured to provide a plurality of impedances coupled to the receiver coil L2 using different ON and OFF combinations of the plurality of switch-capacitor networks. In some embodiments, the plurality of impedances includes a first impedance corresponding to a high state of the ASK modulation and a second impedance corresponding to a low state of the ASK modulation.

The modulation apparatus 218 in the receiver functions as an ASK modulator. The demodulation apparatus 208 in the transmitter functions as an ASK demodulator. The ASK demodulator detects the high state and the low state of the ASK modulation and retrieves the communication information through demodulating the variation of the state of the ASK modulation.

One skilled in the art will recognize that the ASK modulation described above is simply one manner of generating the in-band communication and that other and alternate embodiment modulations could be employed (such as frequency shift keying modulation) for this function.

In some embodiments, the demodulation apparatus 208 comprises a differential amplifier unit, a dc blocking unit, a reference crossing comparator unit, a logic unit and a data extraction circuit.

In some embodiments, the differential amplifier unit has a first input coupled to a common node of a first coil and a first resonant capacitor of the wireless power transfer system, and a second input coupled to a switching node of a bridge in the transmitter of the wireless power transfer system. The detailed structure of the differential amplifier unit will be discussed below with respect to FIG. 5.

In some embodiments, the dc blocking unit has an input coupled to an output of the differential amplifier unit. The reference crossing comparator unit has an input coupled to an output of the dc blocking unit. The logic unit has a first input coupled to an output of the reference crossing comparator unit and a second input coupled to the switching node of the bridge. The logic unit is configured to generate a signal for retrieving a modulated signal. The detailed structures of the dc blocking unit, the reference crossing comparator unit and the logic unit will be discussed below with respect to FIG. 5.

In some embodiments, the data extraction circuit has an input coupled to an output of the logic unit. The data extraction circuit comprises a band-pass filter unit, a low frequency signal amplifier unit and a comparator unit connected in cascade. The data extraction circuit is configured to extract a low frequency data signal from a high frequency carrier signal. The detailed structure of the data extraction circuit will be discussed below with respect to FIG. 7.

Figure 2:
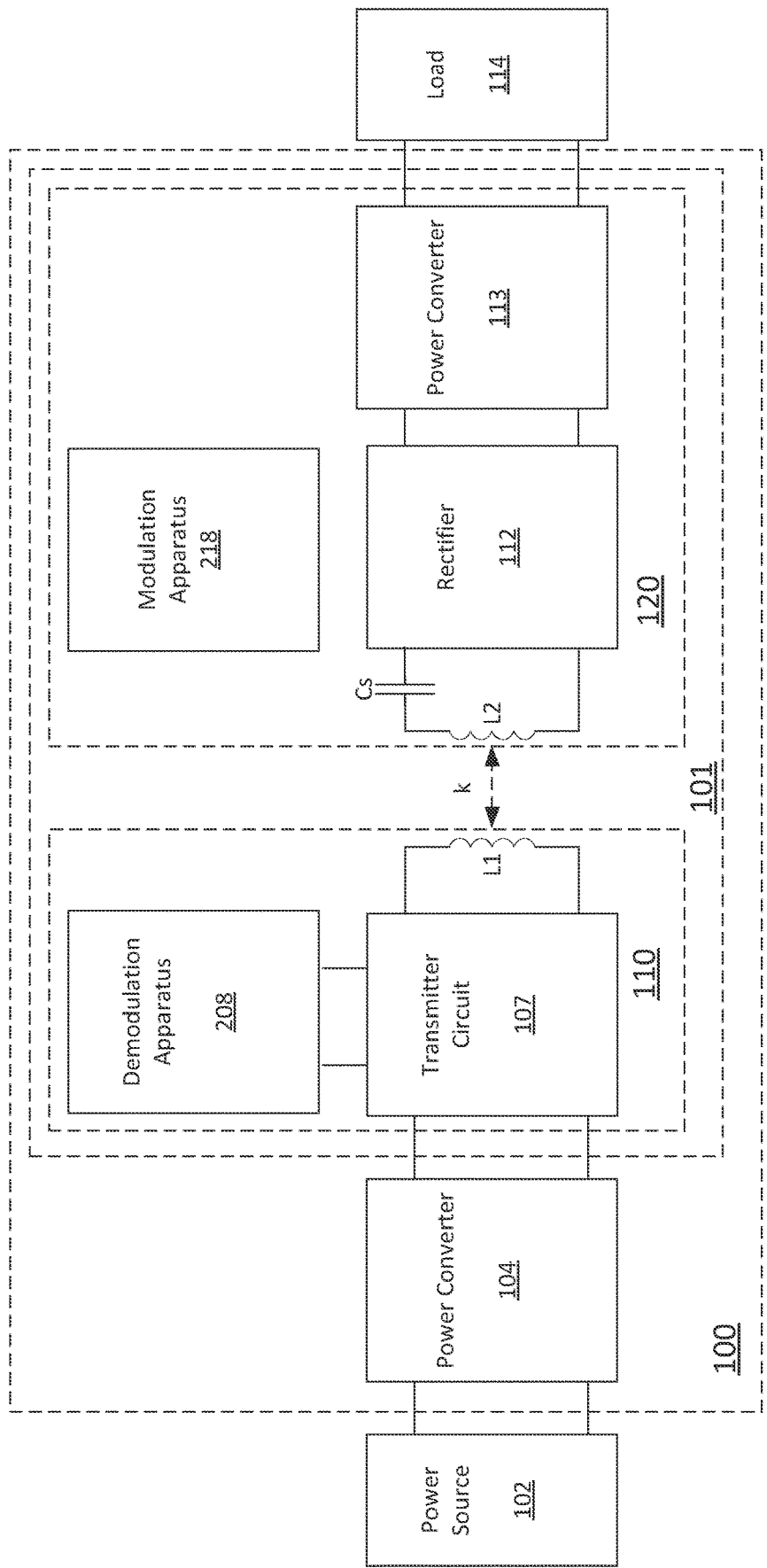
FIG. 2 illustrates a block diagram of the wireless power transfer system in accordance with various embodiments of the present disclosure.

FIG. 2 illustrates a block diagram of the wireless power transfer system in accordance with various embodiments of the present disclosure. The wireless power transfer system 100 comprises a power converter 104 and a wireless power transfer device 101 connected in cascade between an input power source 102 and a load 114. In some embodiments, the power converter 104 is employed to further improve the performance of the wireless power transfer system 100. In alternative embodiments, the power converter 104 is an optional element. In other words, the wireless power transfer device 101 may be connected to the input power source 102 directly.

The wireless power transfer device 101 includes a transmitter 110 and a receiver 120. As shown in FIG. 2, the transmitter 110 comprises a transmitter circuit 107 and a transmitter coil L1 connected in cascade. The input of the transmitter circuit 107 is coupled to an output of the power converter 104. The transmitter 110 further comprises a demodulation apparatus 208.

The receiver 120 comprises a receiver coil L2, a resonant capacitor Cs, a rectifier 112 and a power converter 113 connected in cascade. As shown in FIG. 2, the resonant capacitor Cs is connected in series with the receiver coil L2 and further connected to the inputs of the rectifier 112. The outputs of the rectifier 112 are connected to the inputs of the power converter 113. The outputs of the power converter 113 are coupled to the load 114. The receiver 120 further comprises a modulation apparatus 218.

The transmitter 110 is magnetically coupled to the receiver 120 through a magnetic field when the receiver 120 is placed near the transmitter 110. A loosely coupled transformer is formed by the transmitter coil L1, which is part of the transmitter 110, and the receiver coil L2, which is part of the receiver 120. As a result, electrical power may be transferred from the transmitter 110 to the receiver 120.

In some embodiments, the transmitter 110 may be inside a charging pad. The transmitter coil L1 is placed underneath the top surface of the charging pad. The receiver 120 may be embedded in a mobile phone. When the mobile phone is placed near the charging pad, a magnetic coupling may be established between the transmitter coil L1 and the receiver coil L2. In other words, the transmitter coil L1 and the receiver coil L2 may form a loosely coupled transformer through which a power transfer occurs between the transmitter 110 and the receiver 120. The strength of coupling between the transmitter coil L1 and the receiver coil L2 is quantified by the coupling coefficient k. In some embodiments, k is in a range from about 0.05 to about 0.9.

In some embodiments, after the magnetic coupling has been established between the transmitter coil L1 and the receiver coil L2, the transmitter 110 and the receiver 120 may form a power system through which power is wirelessly transferred from the input power source 102 to the load 114.

The input power source 102 may be a power adapter converting a utility line voltage to a direct current (dc) voltage. Alternatively, the input power source 102 may be a renewable power source such as a solar panel array. Furthermore, the input power source 102 may be any suitable energy storage devices such as rechargeable batteries, fuel cells, any combinations thereof and/or the like.

The load 114 represents the power consumed by the mobile device (e.g., a mobile phone) coupled to the receiver 120. Alternatively, the load 114 may refer to a rechargeable battery and/or batteries connected in series/parallel, and coupled to the output of the receiver 120. Furthermore, the load 114 may be a downstream power converter such as a battery charger.

The transmitter circuit 107 may comprise primary side switches of a full bridge converter according to some embodiments. Alternatively, the transmitter circuit 107 may comprise the primary side switches of any other suitable power converters such as a half bridge converter, a push-pull converter, any combinations thereof and/or the like.

It should be noted that the power converters described above are merely examples. One having ordinary skill in the art will recognize other suitable power converters such as class E topology based power converters (e.g., a class E amplifier), may alternatively be used depending on design needs and different applications.

Figure 3:
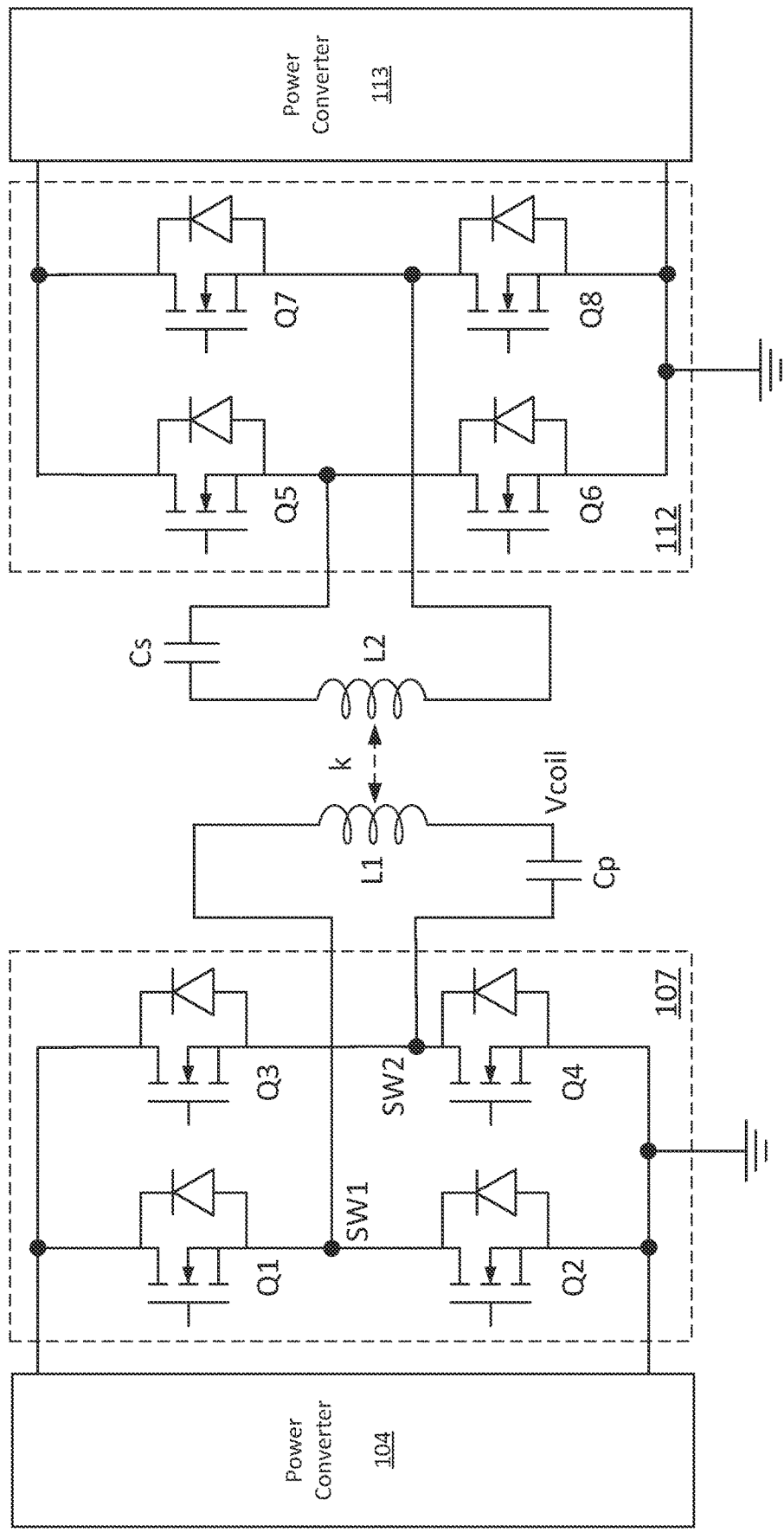
FIG. 3 illustrates a schematic diagram of the wireless power transfer system in accordance with various embodiments of the present disclosure.

The transmitter circuit 107 may further comprise a resonant capacitor (not shown but illustrated in FIG. 3). Throughout the description, this resonant capacitor may be alternatively referred to as a transmitter resonant capacitor or a first resonant capacitor. The resonant capacitor and the magnetic inductance of the transmitter coil may form a resonant tank. Depending on design needs and different applications, the resonant tank may further include a resonant inductor. In some embodiments, the resonant inductor may be implemented as an external inductor. In alternative embodiments, the resonant inductor may be implemented as a connection wire.

The receiver 120 comprises the receiver coil L2 magnetically coupled to the transmitter coil L1 after the receiver 120 is placed near the transmitter 110. As a result, power may be transferred to the receiver coil and further delivered to the load 114 through the rectifier 112. The receiver 120 may comprise a secondary resonant capacitor Cs as shown in FIG. 2. Throughout the description, the secondary resonant capacitor Cs may be alternatively referred to as a receiver resonant capacitor or a second resonant capacitor.

The receiver 120 may further comprise a communication apparatus. The communication apparatus comprising a plurality of first capacitor-switch networks and a plurality of second capacitor-switch networks. The plurality of first capacitor-switch networks is connected in parallel between a first input terminal of the rectifier 112 and ground. The plurality of second capacitor-switch networks is connected in parallel between a second input terminal of the rectifier 112 and ground. The on and off of the plurality of first capacitor-switch networks and the plurality of second capacitor-switch networks are controlled such that the demodulation apparatus 218 and the modulation apparatus 208 are able to provide the in-band communication between the receiver 120 and the transmitter 110.

The rectifier 112 converts an alternating polarity waveform received from the resonant tank comprising the receiver coil L2 and the receiver resonant capacitor Cs to a single polarity waveform. The rectifier 112 can be a full-wave diode bridge or a half-wave diode bridge. In some embodiments, the rectifier 112 comprises a full-wave diode bridge and an output capacitor. In alternative embodiments, the full-wave diode bridge may be replaced by a full-wave bridge formed by switching elements such as n-type metal oxide semiconductor (NMOS) transistors.

Furthermore, the rectifier 112 may be formed by other types of controllable devices such as metal oxide semiconductor field effect transistor (MOSFET) devices, bipolar junction transistor (BJT) devices, super junction transistor (SJT) devices, insulated gate bipolar transistor (IGBT) devices, gallium nitride (GaN) based power devices and/or the like. The detailed operation and structure of the rectifier 112 are well known in the art, and hence are not discussed herein.

The power converter 113 is coupled between the rectifier 112 and the load 114. The power converter 113 is a non-isolated power converter. In some embodiments, the power converter 113 is implemented as a linear regulator such as a low-dropout regulator (LDO). In alternative embodiments, the power converter 113 is implemented as a step-down power converter such as a buck converter. Moreover, the power converter 113 may be implemented as a four-switch buck-boost power converter.

Furthermore, the power converter 113 may be implemented as a hybrid power converter. The hybrid converter is a non-isolated power converter. By controlling the on/off of the switches of the hybrid converter, the hybrid converter can be configured as a buck converter, a charge pump converter or a hybrid converter.

Moreover, the power converter 113 may comprise a first power stage and a second power stage connected in cascade. The first power stage is configured to operate in different modes for efficiently charging the load 114 (e.g., a rechargeable battery). In some embodiments, the first stage may be implemented as a step-down power converter (e.g., a buck converter), a four-switch buck-boost converter, a hybrid converter and any combinations thereof. The second power stage is configured as a voltage divider or an isolation switch.

FIG. 3 illustrates a schematic diagram of the wireless power transfer system in accordance with various embodiments of the present disclosure. The transmitter circuit 107 comprises a full bridge converter. As shown in FIG. 3, the full bridge converter comprises a first switch Q1 and a second switch Q2, a third switch Q3 and a fourth switch Q4. The first switch Q1 and the second switch Q2 are connected in series between a first voltage bus and a second voltage bus. The third switch Q3 and the fourth switch Q4 are connected in series between the first voltage bus and the second voltage bus.

The first voltage bus is connected to a first output of the power converter 104. The second voltage bus is connected to a second output of the power converter 104 and ground. A common node of the first switch Q1 and the second switch Q2 is denoted as SW1. Throughout the description, SW1 is alternatively referred to as a first switching node. A common node of the third switch Q3 and the fourth switch Q4 is denoted as SW2. Throughout the description, SW2 is alternatively referred to as a second switching node.

A first coil L1 and a first resonant capacitor Cp are connected in series between the common node (SW1) of the first switch Q1 and the second switch Q2, and the common node (SW2) of the third switch Q3 and the fourth switch Q4. A common node of the first coil L1 and the first resonant capacitor Cp is denoted as Vcoil as shown in FIG. 3.

The first coil L1 is magnetically coupled to a second coil L2. The second coil L2 and a second resonant capacitor Cs are connected in series between a first input and a second input of the rectifier 112.

The rectifier 112 comprises a fifth switch Q5, a sixth switch Q6, a seventh switch Q7 and an eighth switch Q8. The fifth switch Q5 and the sixth switch Q6 are connected in series between a third voltage bus and a fourth voltage bus. The seventh switch Q7 and the eighth switch Q8 are connected in series between the third voltage bus and the fourth voltage bus.

The third voltage bus is connected to a first input of the power converter 113. The fourth voltage bus is connected to a second input of the power converter 113 and ground. A common node of the fifth switch Q5 and the sixth switch Q6 is the first input of the rectifier 112. A common node of the seventh switch Q7 and the eighth switch Q8 is the second input of the rectifier 112.

Figure 4:
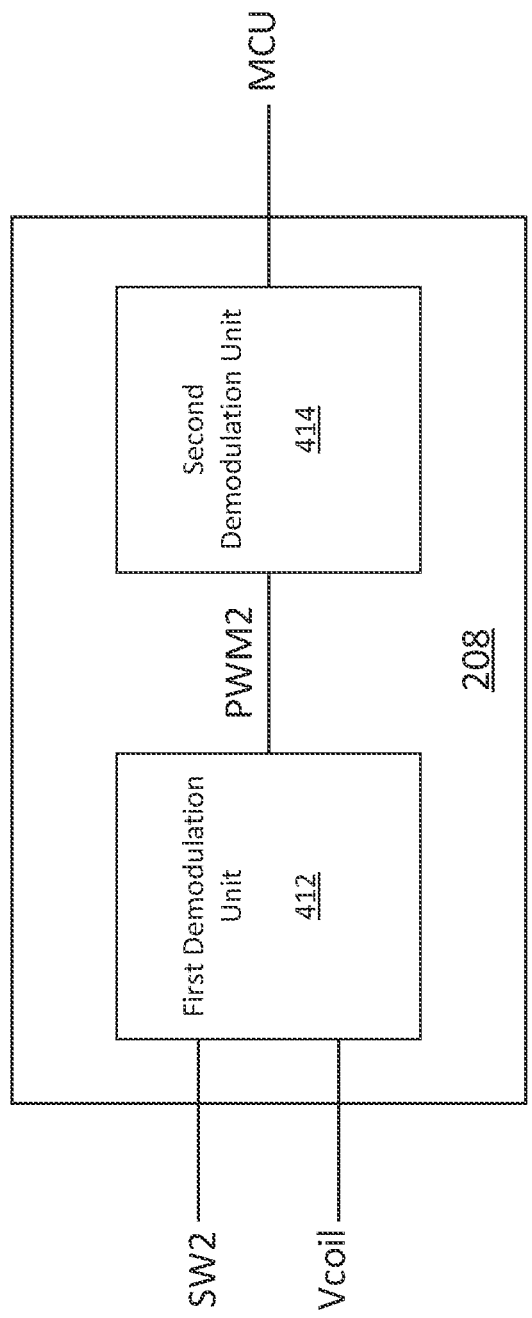
FIG. 4 illustrates a block diagram of the demodulation apparatus shown in FIG. 1 in accordance with various embodiments of the present disclosure.

FIG. 4 illustrates a block diagram of the demodulation apparatus shown in FIG. 1 in accordance with various embodiments of the present disclosure. The demodulation apparatus 208 comprises a first demodulation unit 412 and a second demodulation unit 414 connected in cascade. As shown in FIG. 4, the first demodulation unit 412 is configured to receive one of the switching node signals (e.g., voltage signal on SW2) and Vcoil. The first demodulation unit 412 is configured to generate a second PWM signal PWM2. The second demodulation unit 414 is configured to receive PWM2 and generate a signal to be processed by a microprocessor (MCU).

In some embodiments, the first demodulation unit 412 comprises a differential amplifier unit, a dc blocking unit, a reference crossing comparator unit and a logic unit connected in cascade. The differential amplifier unit comprises a first input coupled to a common node of a first coil L1 and a first resonant capacitor Cp, and a second input coupled to a switching node (SW2) of a bridge (e.g., full bridge shown in FIG. 3). The dc blocking unit comprises an input coupled to an output of the differential amplifier unit. The reference crossing comparator unit has an input coupled to an output of the dc blocking unit. The logic unit has a first input coupled to an output of the reference crossing comparator unit and a second input coupled to the switching node of the bridge. The logic unit is configured to generate a signal for retrieving a modulated signal. The detailed structure of the first demodulation unit 412 will be discussed below with respect to FIG. 5.

In some embodiments, the second demodulation unit 414 comprises a band-pass filter unit, a low frequency signal amplifier unit and a comparator unit connected in cascade. The detailed structure of the second demodulation unit 414 will be discussed below with respect to FIG. 7.

Figure 5:
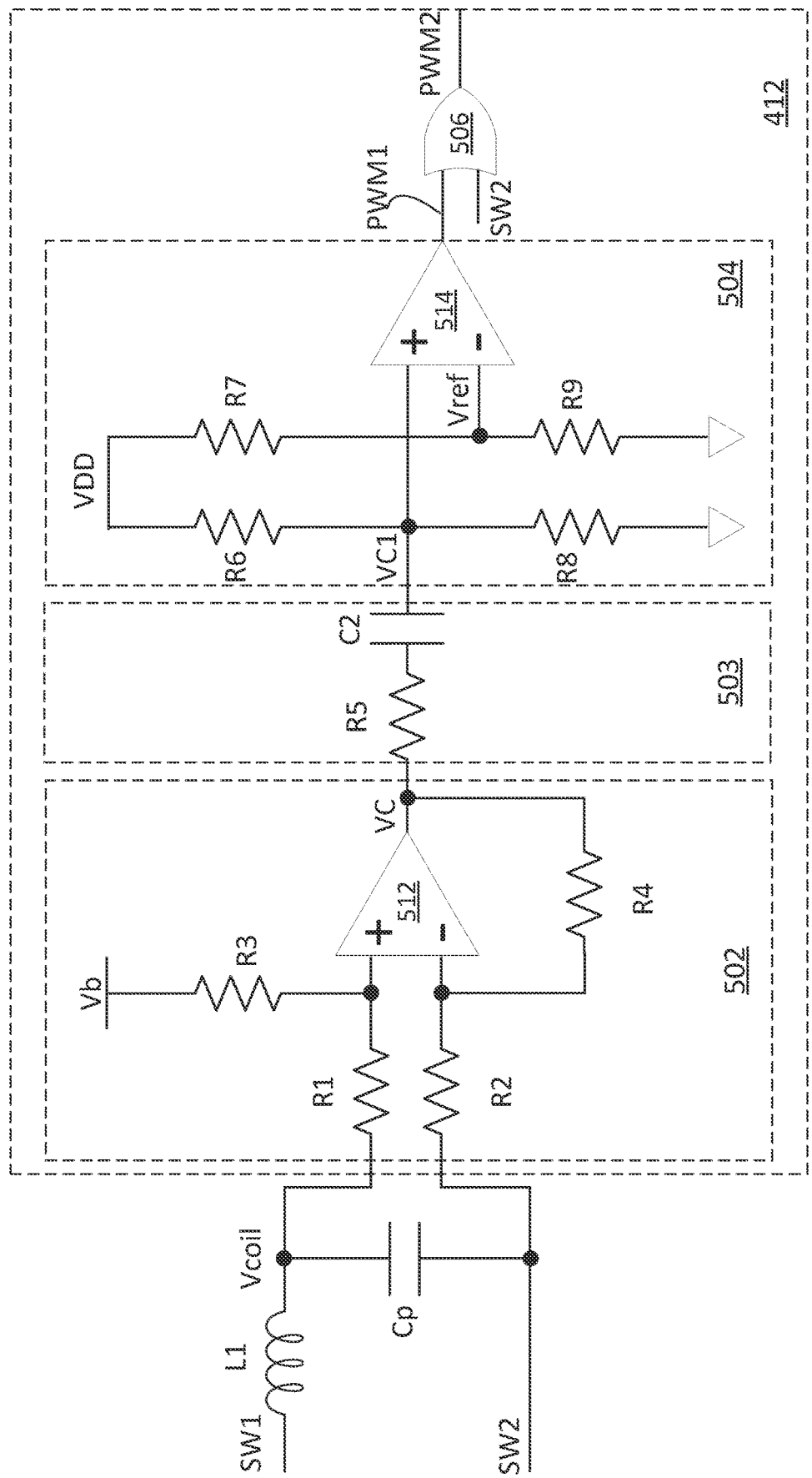
FIG. 5 illustrates a schematic diagram of the first demodulation unit shown in FIG. 4 in accordance with various embodiments of the present disclosure.

FIG. 5 illustrates a schematic diagram of the first demodulation unit shown in FIG. 4 in accordance with various embodiments of the present disclosure. The first demodulation unit 412 comprises a differential amplifier unit 502, a dc blocking unit 503, a reference crossing comparator unit 504 and a logic unit 506 connected in cascade.

In some embodiments, the differential amplifier unit 502 is implemented as a differential input to single-ended converter. The differential amplifier unit 502 comprises a first resistor R1, a second resistor R2, a third resistor R3, a fourth resistor R4 and a first amplifier 512. As shown in FIG. 5, the first resistor R1 is connected between a first input of the differential amplifier unit 502 and a non-inverting input of the first amplifier 512. The second resistor is connected between the second input of the differential amplifier unit 502 and an inverting input of the first amplifier 512. The third resistor R3 is connected between a bias voltage Vb and the non-inverting input of the first amplifier 512. In some embodiments, the bias voltage Vb is 1.8 V. In alternative embodiments, the bias voltage Vb is 2.5 V. The fourth resistor R4 is connected between the inverting input of the first amplifier 512 and an output of the first amplifier 512.

It should be noted that FIG. 5 illustrates R3 is connected to a bias voltage Vb. This connection shown in FIG. 5 is used to illustrate the inventive aspects of the various embodiments. Depending on different applications and design needs, there may be many variations, alternatives, and modifications. For example, R3 may be connected to ground. Under this system configuration, the first amplifier 512 should be supplied by two different power sources.

In operation, the differential amplifier unit 502 is configured to receive an input signal. In particular, this input signal is a differential input signal tapped across the first resonant capacitor Cp. In some embodiments, this differential input signal includes a sinusoidal component and a square waveform component. The differential amplifier unit 502 is able to remove the square waveform component form the input signal and generate an output signal VC. Throughout the description, VC is alternatively referred to as an intermediate signal. In some embodiments, the output signal VC is a sinusoidal signal having a dc offset.

In some embodiments, R1 and R2 are 200K Ohm resistors. R3 and R4 are 50K Ohm resistors. The resistance values of R1, R2, R3 and R4 indicate that the differential amplifier unit 502 is able to reduce the amplitude of the input signal.

The dc blocking unit 503 comprises a fifth resistor R5 and a dc blocking capacitor C2 connected in series. The output signal (VC) of the differential amplifier unit 502 is fed into the dc blocking unit 503. Once the output signal (VC) passes through the dc blocking unit 503, the dc offset has been removed. In other words, the output signal VC1 of the dc blocking unit 503 is a sinusoidal signal.

The reference crossing comparator unit 504 comprises a sixth resistor R6, a seventh resistor R7, an eighth resistor R8, a ninth resistor R9 and a first comparator 514. As shown in FIG. 5, the sixth resistor R6 and the eighth resistor R8 are connected in series between a supply voltage VDD and ground. A common node of the sixth resistor R6 and the eighth resistor R8 is connected to the input of the reference crossing comparator unit 504. The seventh resistor R7 and the ninth resistor R9 are connected in series between the supply voltage VDD and ground. A non-inverting input of the first comparator 514 is connected to the common node of the sixth resistor R6 and the eighth resistor R8. An inverting input of the first comparator 514 is connected to a common node of the seventh resistor R7 and the ninth resistor R9. The voltage at the inverting input of the first comparator 514 is a reference voltage Vref.

In some embodiments, the resistors R6, R7, R8 and R9 have a same resistance value. In some embodiments, R6, R7, R8 and R9 are 100K Ohm resistors. In some embodiments, the supply voltage VDD is 3.3 V.

In operation, the reference crossing comparator unit 504 is configured to convert a sinusoidal signal generated by the dc blocking unit 503 into a first PWM signal PWM1. As shown in FIG. 5, R6 and R8 form a first voltage divider. R7 and R9 form a second voltage divider. The voltage at the inverting input of the first comparator 514 is equal to one half of the supply voltage VDD. The voltage at the non-inverting input of the first comparator 514 is equal to a sum of one half of the supply voltage VDD and the sinusoidal signal (VC1).

In operation, once the voltage at the non-inverting input of the first comparator 514 is greater than the voltage at the inverting input of the first comparator 514, the output (PWM1) of the first comparator 514 changes from a logic low state to a logic high state. On the other hand, when the voltage at the inverting input of the first comparator 514 is greater than the voltage at the non-inverting input of the first comparator 514, the output (PWM1) of the first comparator 514 changes from a logic high state to a logic low state. As a result, a PWM signal is generated at the output of the first comparator 514. This PWM signal is referred to as the first PWM signal PWM1. The process of generating the first PWM signal PWM1 will be discussed in detail below with respect to FIG. 6.

The logic unit 506 is an OR gate. This OR gate is configured to combine the first PWM signal PWM1 and a voltage signal SW2 on the switching node into a second PWM signal PWM2. The second PWM signal is used to retrieve the modulated signal sent by the receiver in the wireless power transfer system.

Figure 6:
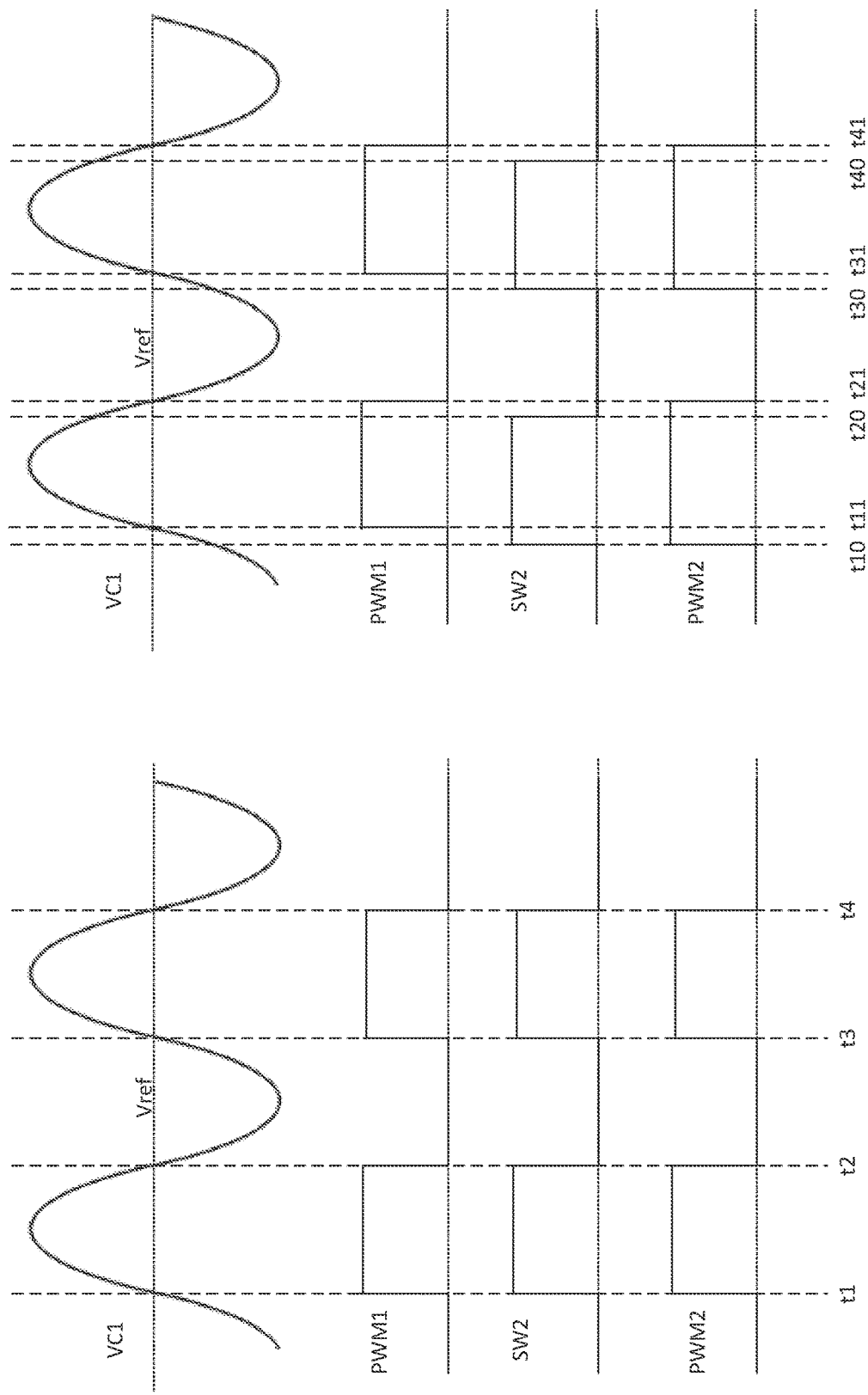
FIG. 6 illustrates a timing diagram of the demodulation process for generating the second PWM signal in accordance with various embodiments of the present disclosure.

FIG. 6 illustrates a timing diagram of the demodulation process for generating the second PWM signal in accordance with various embodiments of the present disclosure. The timing diagram includes four rows. The first row represents a sinusoidal waveform (VC1 shown in FIG. 5). The second row represents the first PWM signal PWM1 shown in FIG. 5. The third row represents the second switching node signal SW2 shown in FIG. 5. The fourth row represents the second PWM signal PWM2 shown in FIG. 5.

The four rows on the left side of FIG. 6 illustrate the operating principle of the demodulation process when the modulation process is not applicable to the wireless power transfer system or the modulation process is in a logic "0" state. The four rows on the right side of FIG. 6 illustrate the operating principle of the demodulation process when the modulation process is in a logic "1" state.

In operation, SW2 is selected as a reference waveform. A person skilled in the art would understand depending on different applications and design needs, SW1 can be selected as the reference waveform.

At t1, VC1 exceeds the reference Vref. In response to this change, PWM1 changes from a logic low state to a logic high state. Since the modulation process is not applicable to the wireless power transfer system or the modulation process is in a logic "0" state, the switching node signal SW2 is in phase with VC1. As shown in FIG. 6, at t1, SW2 changes from a low voltage to a high voltage. The second PWM signal PMW2 is the combination of SW2 and PWM1 through an OR operation performed on SW2 and PWM1. As a result of this OR operation, PWM2 changes from a logic low state to a logic high state at t1.

At t2, VC1 drops below the reference Vref. In response to this change, PWM1 changes from a logic high state to a logic low state. At t2, SW2 changes from a high voltage to a low voltage. The second PWM signal PMW2 is the combination of SW2 and PWM1 through an OR operation performed on SW2 and PWM1. As a result of this OR operation, PWM2 changes from a logic high state to a logic low state at t2. The operating principle at t3 and t4 is similar to that at t1 and t2, and hence is not discussed again to avoid repetition.

At t10, SW2 changes from a low voltage to a high voltage. Since the modulation process is in a logic "1" state, VC1 has a phase shift from the reference waveform SW2. As shown in FIG. 6, at t10, VC1 has not reached Vref. PWM1 remains at a logic low state. The second PWM signal PMW2 is the combination of SW2 and PWM1 through an OR operation performed on SW2 and PWM1. As a result of this OR operation, PWM2 changes from a logic low state to a logic high state at t10.

At t11, VC1 exceeds the reference Vref. In response to this change, PWM1 changes from a logic low state to a logic high state at t11. This logic change of PWM1 has no impact on PWM2.

At t20, SW2 changes from a high voltage to a low voltage. This voltage change of SW2 has no impact on PWM2. At t21, VC1 drops below the reference Vref. In response to this change, PWM1 changes from a logic high state to a logic low state. The second PWM signal PMW2 is the combination of SW2 and PWM1 through an OR operation performed on SW2 and PWM1. As a result of this OR operation at t21, PWM2 changes from a logic high state to a logic low state. The operating principle at t30, t31, t40 and t41 is similar to that at t10, t11, t20 and t21, and hence is not discussed again to avoid repetition.

As shown in FIG. 6, when the modulation process is in a logic "1" state, the second PWM signal PWM2 has a logic high portion (e.g., from t10 to t21) extending over the high voltage portion (e.g., from t10 to t20) of the reference waveform SW2. This extended portion can be used to retrieve the logic "1" state of the modulation process.

It should be noted that the duty cycle (about 50%) of the switching node signal SW2 is merely an example. One of ordinary skill in the art would recognize many variations, alternatives, and modifications.

It should further be noted that the OR operation performed on SW2 and PWM1 is merely an example, which should not unduly limit the scope of the claims. One of ordinary skill in the art would recognize many variations, alternatives, and modifications. For example, an AND operation may be performed on SW2 and PWM1 to generate PWM2. Under this system configuration, when the modulation process is in a logic "1" state, the second PWM signal PWM2 has a logic high portion (e.g., from t11 to t20) shorter than the high voltage portion (e.g., from t10 to t20) of the reference waveform SW2. This difference can be used to retrieve the logic "1" state of the modulation process.

One advantageous feature of having the demodulation method shown in FIG. 6 is that the demodulation method is able to reliably retrieve the data signal in a high frequency wireless power transfer system.

Figure 7:
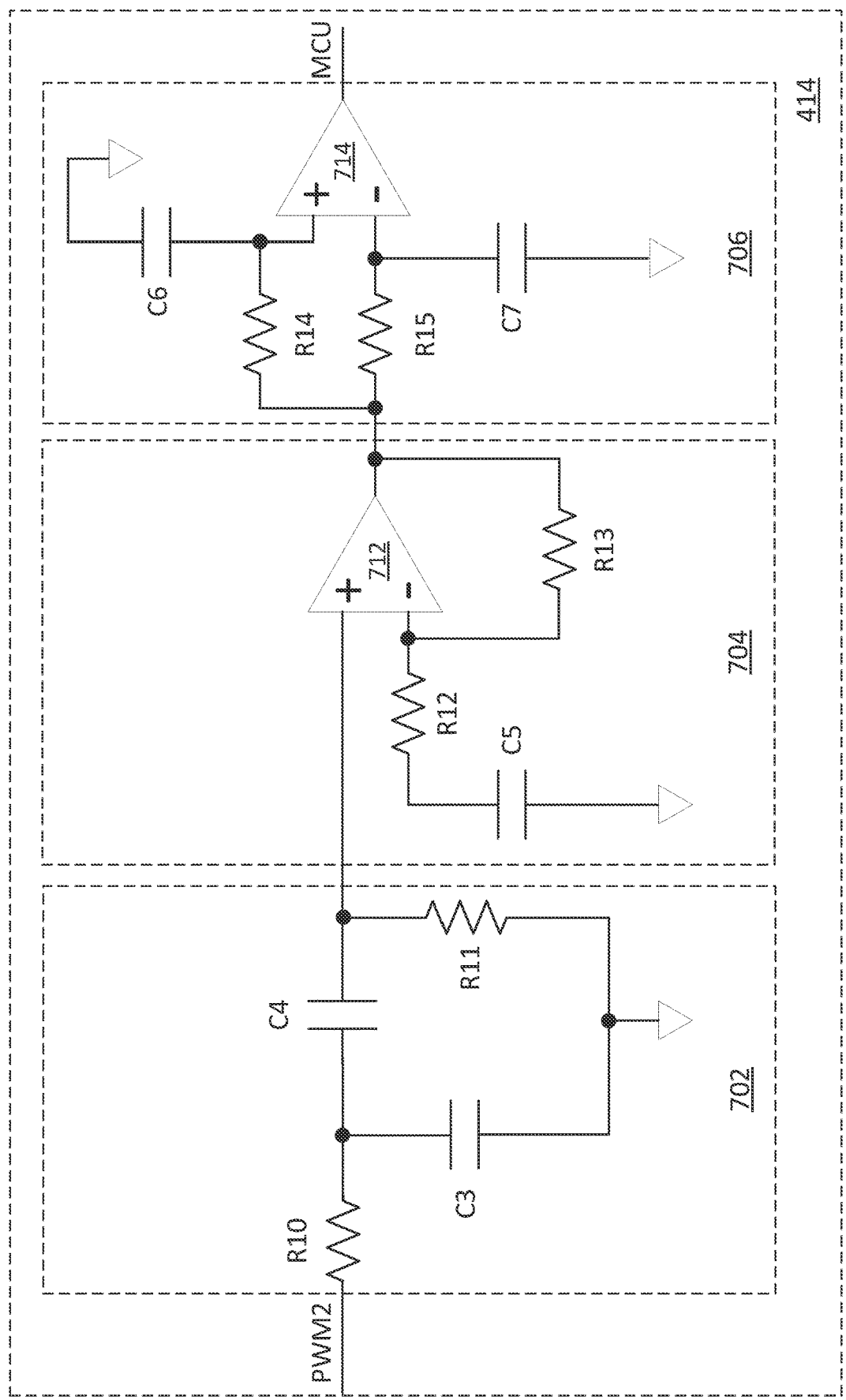
FIG. 7 illustrates a schematic diagram of the second demodulation unit shown in FIG. 4 in accordance with various embodiments of the present disclosure.

FIG. 7 illustrates a schematic diagram of the second demodulation unit shown in FIG. 4 in accordance with various embodiments of the present disclosure. The second demodulation unit 414 has an input configured to receive the second PWM signal PWM2 and generate a signal to be processed by a microprocessor. In the modulation process, the carrier signal is of a high frequency (e.g., 360K Hz). The data signal is of a low frequency (e.g., 2K Hz). The second demodulation unit 414 functions as a data extraction circuit configured to retrieve the low frequency data signal from the high frequency carrier signal. Throughout the description, the second demodulation unit 414 may be alternatively referred to as a data extraction circuit.

As shown in FIG. 7, the data extraction circuit 414 comprises a band-pass filter unit 702, a low frequency signal amplifier unit 704 and a comparator unit 706 connected in cascade.

The band-pass filter unit 702 comprises a tenth resistor R10, an eleventh resistor R11, a third capacitor C # and a fourth capacitor C4. The tenth resistor R10 and a fourth capacitor C4 are connected in series between an input and an output of the band-pass filter unit 702. The third capacitor C3 is connected between a common node of the tenth resistor R10 and the fourth capacitor C4, and ground. The eleventh resistor R11 is connected between the output of the band-pass filter unit 702 and ground.

In operation, depending on different logic stages, the second PWM signal PWM2 has different duty cycles. For example, when the modulation process is in a logic "0" state, PWM2 is of a first duty cycle (e.g., 50%). When the modulation process is in a logic "1" state, PWM2 is of a second duty cycle (e.g., 60%). R10 and C3 form a low-pass filter. Once PWM2 passes through the low-pass filter, the high frequency carrier signal has been removed. The remaining signal at the output of the low-pass filter comprises the data signal and a dc offset. The remaining signal is fed into a dc blocking circuit formed by C4 and R11. At the output of the dc blocking circuit, the dc offset has been removed, and the data signal has been retrieved.

The low frequency signal amplifier unit 704 comprises a twelfth resistor R12, a thirteenth resistor R13, a fifth capacitor C5 and a second amplifier 712. The second amplifier 712 has a non-inverting input connected to the output of the band-pass filter unit 702. The twelfth resistor R12 and the fifth capacitor C5 are connected in series between an inverting input of the second amplifier 712 and ground. The thirteenth resistor R13 is connected between the inverting input of the second amplifier 712 and an output of the second amplifier 712.

In operation, the output of the band-pass filter unit 702 is a small ac signal. The low frequency signal amplifier unit 704 is configured to amplify this small ac signal to a predetermined level suitable for downstream processing.

The comparator unit 706 comprises a fourteenth resistor R14, a fifteenth resistor R15, a sixth capacitor C6, a seventh capacitor C7 and a second comparator 714. The fourteenth resistor R14 and the sixth capacitor C6 are connected in series between an input of the comparator unit 706 and ground. The fifteenth resistor R15 and the seventh capacitor C7 are connected in series between the input of the comparator unit 706 and ground. A non-inverting input of the second comparator 714 is connected to a common node of the fourteenth resistor R14 and the sixth capacitor C6. An inverting input of the second comparator 714 is connected to a common node of the fifteenth resistor R15 and the seventh capacitor C7.

In operation, the comparator unit 706 is configured to convert the ac signal generated by the low frequency signal amplifier unit 704 into a square waveform signal for microprocessor-based operation and processing.

Figure 8:
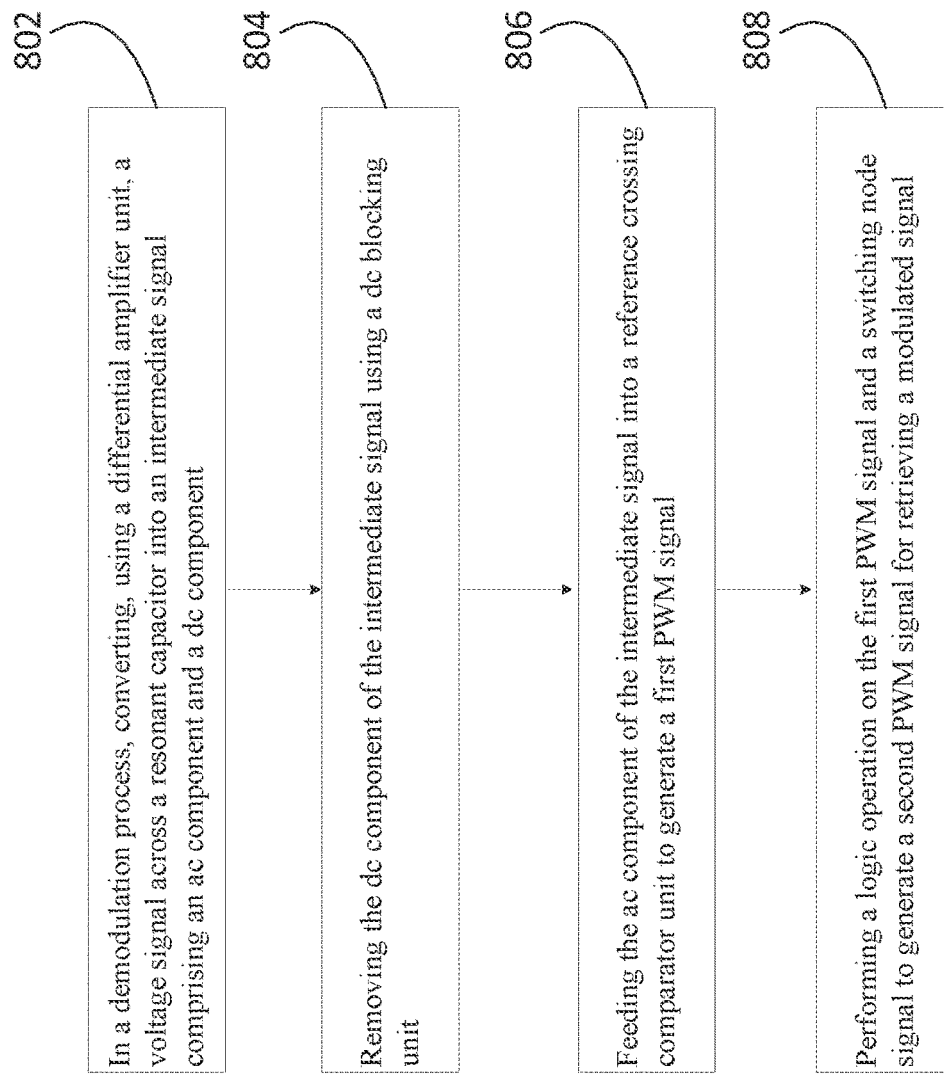
FIG. 8 illustrates a flow chart showing a method of demodulating a signal in a wireless power transfer system in accordance with various embodiments of the present disclosure.

FIG. 8 illustrates a flow chart showing a method of demodulating a signal in a wireless power transfer system in accordance with various embodiments of the present disclosure. This flowchart shown in FIG. 8 is merely an example, which should not unduly limit the scope of the claims. One of ordinary skill in the art would recognize many variations, alternatives, and modifications. For example, various steps illustrated in FIG. 8 may be added, removed, replaced, rearranged and repeated.

Referring back to FIG. 3, a transmitter coil (e.g., L1) is configured to be magnetically coupled to a receiver coil (e.g., L2). A resonant capacitor (e.g., Cp) is connected in series with the transmitter coil between a first switching node (e.g., SW1) and a second switching node (e.g., SW2) of a full bridge converter. Referring back to FIG. 4, a demodulation apparatus (e.g., demodulation apparatus 208) comprises a first demodulation unit (e.g., first demodulation unit 412) and a second demodulation unit (e.g., second demodulation unit 414) connected in cascade.

At step 802, in a demodulation process, a voltage signal across a resonant capacitor is converted into an intermediate signal comprising an ac component and a dc component using a differential amplifier unit.

At step 804, the dc component of the intermediate signal is removed using a dc blocking unit.

At step 806, the ac component of the intermediate signal is fed into a reference crossing comparator unit to generate a first PWM signal.

At step 808, a logic operation is performed on the first PWM signal and a switching node signal to generate a second PWM signal for retrieving a modulated signal.

Referring back to FIG. 3, the resonant capacitor is in a transmitter of a wireless power transfer system, and wherein the resonant capacitor and a transmitter coil are connected in series between a first switching node and a second switching node of a full bridge converter comprising a first switch and a second switch connected in series between a first voltage bus and a second voltage bus, and a third switch and a fourth switch connected in series between the first voltage bus and the second voltage bus, and wherein the first switching node is a common node of the first switch and the second switch, and the switching node is a common node of the third switch and the fourth switch, and wherein the switching node signal is tapped from one of the first switching node and the second switching node.

The method further comprises in the step of performing the logic operation on the first PWM signal and a switching node signal to generate the second PWM signal for retrieving a modulated signal, feeding the first PWM signal and the switching node signal into an OR gate to combine the first PWM signal and the switching node signal into the second PWM signal.

The voltage signal across the resonant capacitor comprises a sinusoidal signal and a square waveform signal, and wherein the differential amplifier unit is configured to remove the square waveform signal and generate the intermediate signal.

The method further comprises extracting a low frequency data signal from the second PWM signal using a data extraction circuit comprising a band-pass filter unit, a low frequency signal amplifier unit and a comparator unit connected in cascade.

Referring back to FIG. 6, the differential amplifier unit comprises a first resistor, a second resistor, a third resistor, a fourth resistor and a first amplifier, and wherein the first resistor is connected between the first input of the differential amplifier unit and a non-inverting input of the first amplifier, the second resistor is connected between the second input of the differential amplifier unit and an inverting input of the first amplifier, the third resistor is connected between a bias voltage and the non-inverting input of the first amplifier, and the fourth resistor is connected between the inverting input of the first amplifier and an output of the first amplifier.

The dc blocking unit comprises a fifth resistor and a dc blocking capacitor connected in series.

The reference crossing comparator unit comprises a sixth resistor, a seventh resistor, an eighth resistor, a ninth resistor and a first comparator, and wherein the sixth resistor and the eighth resistor are connected in series between a supply voltage and ground, and wherein a common node of the sixth resistor and the eighth resistor is connected to the input of the reference crossing comparator unit, the seventh resistor and the ninth resistor are connected in series between the supply voltage and ground, a non-inverting input of the first comparator is connected to the common node of the sixth resistor and the eighth resistor, and an inverting input of the first comparator is connected to the common node of the seventh resistor and the ninth resistor.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a differential amplifier circuit having a first input coupled to a common node of a first coil and a first resonant capacitor, and a second input coupled to a switching node of a bridge;
   a reference crossing comparator circuit having an input coupled to an output of the differential amplifier circuit; and
   a logic circuit having a first input coupled to an output of the reference crossing comparator circuit and a second input coupled to the switching node of the bridge, wherein the logic circuit is configured to generate a signal for retrieving a modulated signal.

2. The apparatus of claim 1, wherein:
   the bridge is a full bridge in a transmitter of a wireless power transfer system, and wherein the bridge comprises:
   a first switch and a second switch connected in series between a first voltage bus and a second voltage bus; and
   a third switch and a fourth switch connected in series between the first voltage bus and the second voltage bus, and wherein the first coil and the first resonant capacitor are connected in series between a common node of the first switch and the second switch, and a common node of the third switch and the fourth switch, and wherein the common node of the third switch and the fourth switch is the switching node of the bridge.

3. The apparatus of claim 1, wherein:
the first coil is configured to be magnetically coupled to a second coil, and wherein the second coil is coupled to a rectifier through a second resonant capacitor.

4. The apparatus of claim 1, wherein:
the differential amplifier circuit comprises a first resistor, a second resistor, a third resistor, a fourth resistor and a first amplifier, and wherein:
the first resistor is connected between the first input of the differential amplifier circuit and a non-inverting input of the first amplifier;
the second resistor is connected between the second input of the differential amplifier circuit and an inverting input of the first amplifier;
the third resistor is connected between a bias voltage and the non-inverting input of the first amplifier; and
the fourth resistor is connected between the inverting input of the first amplifier and an output of the first amplifier.

5. The apparatus of claim 4, wherein:
the differential amplifier circuit is configured to receive an input signal including a sinusoidal component and a square waveform component, and generate an output signal by removing the square waveform component from the input signal.

6. The apparatus of claim 1, further comprising a dc blocking circuit connected between the output of the differential amplifier circuit and the input of the reference crossing comparator, wherein:
the dc blocking circuit comprises a fifth resistor and a dc blocking capacitor connected in series.

7. The apparatus of claim 1, wherein:
the reference crossing comparator circuit comprises a sixth resistor, a seventh resistor, an eighth resistor, a ninth resistor and a first comparator, and wherein:
the sixth resistor and the eighth resistor are connected in series between a supply voltage and ground, and wherein a common node of the sixth resistor and the eighth resistor is connected to the input of the reference crossing comparator circuit;
the seventh resistor and the ninth resistor are connected in series between the supply voltage and ground;
a non-inverting input of the first comparator is connected to the common node of the sixth resistor and the eighth resistor; and
an inverting input of the first comparator is connected to a common node of the seventh resistor and the ninth resistor.

8. The apparatus of claim 7, wherein:
the reference crossing comparator circuit is configured to convert a sinusoidal signal generated by the dc blocking circuit into a first PWM signal.

9. The apparatus of claim 7, wherein:
the logic circuit is an OR gate configured to combine the first PWM signal and a voltage signal on the switching node into a second PWM signal, and wherein the second PWM signal is used to retrieve the modulated signal.

10. The apparatus of claim 1, further comprising:
a data extraction circuit having an input coupled to an output of the logic circuit, wherein the data extraction circuit comprises a band-pass filter circuit, a low frequency signal amplifier circuit and a comparator circuit connected in cascade.

11. The apparatus of claim 10, wherein:
the band-pass filter circuit comprises:
a tenth resistor and a fourth capacitor connected in series between an input and an output of the band-pass filter circuit;
a third capacitor connected between a common node of the tenth resistor and the fourth capacitor, and ground; and
an eleventh resistor connected between the output of the band-pass filter circuit and ground;
the low frequency signal amplifier circuit comprises:
a second amplifier having a non-inverting input connected to the output of the band-pass filter circuit;
a twelfth resistor and a fifth capacitor connected in series between an inverting input of the second amplifier and ground; and
a thirteenth resistor connected between the inverting input of the second amplifier and an output of the second amplifier;
the comparator circuit comprises:
a fourteenth resistor and a sixth capacitor connected in series between an input of the comparator circuit and ground;
a fifteenth resistor and a seventh capacitor connected in series between the input of the comparator circuit and ground; and
a second comparator having a non-inverting input connected to a common node of the fourteenth resistor and the sixth capacitor, an inverting input connected to a common node of the fifteenth resistor and the seventh capacitor and an output configured to generate a data signal for microprocessor-based processing.

12. A method comprising:
in a demodulation process, converting, using a differential amplifier circuit, a voltage signal across a resonant capacitor into an intermediate signal comprising an ac component and a dc component;
removing the dc component of the intermediate signal using a dc blocking circuit;
feeding the ac component of the intermediate signal into a reference crossing comparator circuit to generate a first PWM signal; and
performing a logic operation on the first PWM signal and a switching node signal to generate a second PWM signal for retrieving a modulated signal.

13. The method of claim 12, wherein:
the resonant capacitor is in a transmitter of a wireless power transfer system, and wherein the resonant capacitor and a transmitter coil are connected in series between a first switching node and a second switching node of a full bridge converter comprising:
a first switch and a second switch connected in series between a first voltage bus and a second voltage bus; and
a third switch and a fourth switch connected in series between the first voltage bus and the second voltage bus, and wherein the first switching node is a common node of the first switch and the second switch, and the second switching node is a common node of the third switch and the fourth switch, and wherein the switching node signal is tapped from one of the first switching node and the second switching node.

14. The method of claim 12, further comprising:
in the step of performing the logic operation on the first PWM signal and a switching node signal to generate the second PWM signal for retrieving a modulated signal, feeding the first PWM signal and the switching node signal into an OR gate to combine the first PWM signal and the switching node signal into the second PWM signal.

15. The method of claim 12, wherein:
the voltage signal across the resonant capacitor comprises a sinusoidal signal and a square waveform signal, and wherein the differential amplifier circuit is configured to remove the square waveform signal and generate the intermediate signal.

16. The method of claim 12, further comprising:
extracting a low frequency data signal from the second PWM signal using a data extraction circuit comprising a band-pass filter circuit, a low frequency signal amplifier circuit and a comparator circuit connected in cascade.

17. The method of claim 12, wherein:
the differential amplifier circuit comprises a first resistor, a second resistor, a third resistor, a fourth resistor and a first amplifier, and wherein:
the first resistor is connected between a first input of the differential amplifier circuit and a non-inverting input of the first amplifier;
the second resistor is connected between a second input of the differential amplifier circuit and an inverting input of the first amplifier;
the third resistor is connected between a bias voltage and the non-inverting input of the first amplifier; and
the fourth resistor is connected between the inverting input of the first amplifier and an output of the first amplifier;
the dc blocking circuit comprises a fifth resistor and a dc blocking capacitor connected in series; and
the reference crossing comparator circuit comprises a sixth resistor, a seventh resistor, an eighth resistor, a ninth resistor and a first comparator, and wherein:
the sixth resistor and the eighth resistor are connected in series between a supply voltage and ground, and wherein a common node of the sixth resistor and the eighth resistor is connected to an input of the reference crossing comparator circuit;
the seventh resistor and the ninth resistor are connected in series between the supply voltage and ground;
a non-inverting input of the first comparator is connected to the common node of the sixth resistor and the eighth resistor; and
an inverting input of the first comparator is connected to a common node of the seventh resistor and the ninth resistor.

18. A system comprising:
a transmitter coil configured to be magnetically coupled to a receiver coil;
a resonant capacitor connected in series with the transmitter coil between a first switching node and a second switching node of a full bridge converter; and
a demodulation apparatus comprising a first demodulation circuit and a second demodulation circuit connected in cascade, wherein the first demodulation circuit comprises:
a differential amplifier circuit having a first input coupled to a common node of the transmitter coil and the resonant capacitor, and a second input coupled to the second switching node of the full bridge converter;
a dc blocking circuit having an input coupled to an output of the differential amplifier circuit;
a reference crossing comparator circuit having an input coupled to an output of the dc blocking circuit; and
a logic circuit having a first input coupled to an output of the reference crossing comparator circuit and a second input coupled to the second switching node of the full bridge converter, wherein the logic circuit is configured to generate a signal for retrieving a modulated signal.

19. The system of claim 18, wherein:
the differential amplifier circuit comprises a first resistor, a second resistor, a third resistor, a fourth resistor and a first amplifier, and wherein:
the first resistor is connected between the first input of the differential amplifier circuit and a non-inverting input of the first amplifier;
the second resistor is connected between the second input of the differential amplifier circuit and an inverting input of the first amplifier;
the third resistor is connected between a bias voltage and the non-inverting input of the first amplifier; and
the fourth resistor is connected between the inverting input of the first amplifier and an output of the first amplifier;
the dc blocking circuit comprises a fifth resistor and a de blocking capacitor connected in series; and
the reference crossing comparator circuit comprises a sixth resistor, a seventh resistor, an eighth resistor, a ninth resistor and a first comparator, and wherein:
the sixth resistor and the eighth resistor are connected in series between a supply voltage and ground, and wherein a common node of the sixth resistor and the eighth resistor is connected to the input of the reference crossing comparator circuit;
the seventh resistor and the ninth resistor are connected in series between the supply voltage and ground;
a non-inverting input of the first comparator is connected to the common node of the sixth resistor and the eighth resistor; and
an inverting input of the first comparator is connected to a common node of the seventh resistor and the ninth resistor.

20. The system of claim 18, wherein the second demodulation circuit comprises a band-pass filter circuit, a low frequency signal amplifier circuit and a comparator circuit connected in cascade, and wherein:
the band-pass filter circuit comprises:
a tenth resistor and a fourth capacitor connected in series between an input and an output of the band-pass filter circuit;
a third capacitor connected between a common node of the tenth resistor and the fourth capacitor, and ground; and
an eleventh resistor connected between the output of the band-pass filter circuit and ground;
the low frequency signal amplifier circuit comprises:
a second amplifier having a non-inverting input connected to the output of the band-pass filter circuit;
a twelfth resistor and a fifth capacitor connected in series between an inverting input of the second amplifier and ground; and
a thirteenth resistor connected between the inverting input of the second amplifier and an output of the second comparator;
the comparator circuit comprises:
a fourteenth resistor and a sixth capacitor connected in series between an input of the comparator circuit and ground;

a fifteenth resistor and a seventh capacitor connected in series between the input of the comparator circuit and ground; and a second comparator having a non-inverting input connected to a common node of the fourteenth resistor and the sixth capacitor, and an inverting input connected to a common node of the fifteenth resistor and the seventh capacitor.

\* \* \* \* \*